Nov. 18, 1969 R. H. F. LLOYD 3,479,233
METHOD FOR SIMULTANEOUSLY FORMING A BURIED LAYER AND SURFACE CONNECTION IN SEMICONDUCTOR DEVICES
Filed Jan. 16, 1967

INVENTOR.
ROBERT H. F. LLOYD
BY Vincent W. Cleary
ATTORNEY

United States Patent Office 3,479,233

Patented Nov. 18, 1969

3,479,233

METHOD FOR SIMULTANEOUSLY FORMING A BURIED LAYER AND SURFACE CONNECTION IN SEMICONDUCTOR DEVICES

Robert H. F. Lloyd, Sunnyvale, Calif., assignor to International Business Machines Corporation, Armonk, N.Y., a corporation of New York Filed Jan. 16, 1967, Ser. No. 609,438
Int. Cl. H01l 7/36
U.S. Cl. 148—174 2 Claims

ABSTRACT OF THE DISCLOSURE

A method for making an integrated circuit transistor. A buried collector layer is produced by epitaxial growth. The base and emitter are diffused into the grown layer. The collector uses impurities with two different diffusion constants (arsenic and phosphorus). This produces a U-shaped buried collector.

BACKGROUND OF THE INVENTION

Field of invention

The manufacture of semiconductor devices.

Description of prior art

Normally, the collector, base and emitter contacts of an integrated circuit transistor must be positioned on the same side of the chip. Consequently, there is a relatively large resistance path from the innermost region (normally the collector) to the side having the contacts. As a consequence, a so-called highly doped "buried collector layer" is utilized. See Integrated Circuits by Warner and Fordemwalt, page 189, McGraw-Hill. Such a buried collector layer reduces the collector resistance due to the low resistance of the highly doped buried collector region. There remains, however, a relatively high resistance path between the buried collector layer and the diffused collector contact region since this buried collector layer is limited upwardly by the collector base junction and/or the diffused base region. Thus, the transistor having a reduced collector resistance.

Accordingly, it is an object of the present invention to provide a new and improved method for producing a buried layer.

A further object of the invention is the provision of a method to produce a low collector resistance with a process step which occurs early in the fabrication sequence thereby minimizing the effect of this process step on overall yield.

A still further object of the invention is the provision of a method to provide a method for producing a transistor having a low collector resistance without etching the chip itself.

SUMMARY OF THE INVENTION

A feature of the invention includes a method for manufacturing a transistor buried layer which utilizes two different dopants which have different diffusion constants so that the dopant with the higher diffusion constant will diffuse up to or adjacent its surface contact region.

Further objects and advantages of the present invention will become more apparent to those skilled in the art from reading the following detailed specification when taken in conjunction with the accompanying drawings wherein:

First step

Figure 1:
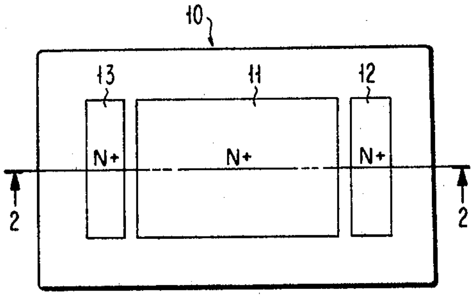
FIG. 1 illustrates a plan view of a semiconductor chip after the first step of an embodiment of the invention.
Figure 2:
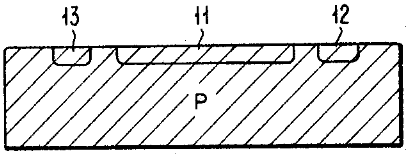
FIG. 2 is a cross-section view taken along lines 2—2 of FIG. 1.

Referring now to FIGS. 1 and 2, a P type silicon chip or substrate 10 is masked and diffused so as to produce rectangularly shaped region 11 during a first time period and highly doped n+ regions 12 and 13 on either side of region 11 during a second time period. A cross-section of these highly doped regions is shown in cross-section in FIG. 2. The dopant used for regions 12 and 13 has a higher diffusion constant than the dopant used for region 11.

Second step

Figure 3:
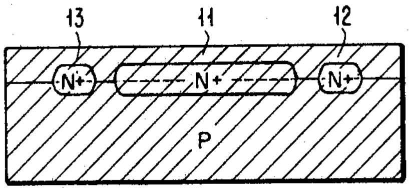
FIG. 3 illustrates the chip shown in FIG. 2 during the second step of an embodiment of the invention.
Figure 4:
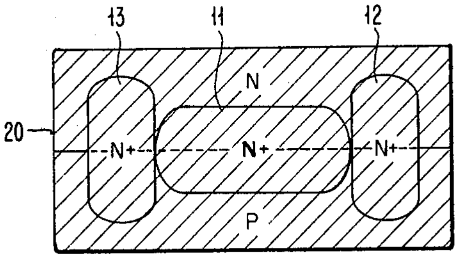
FIG. 4 illustrates the chip shown in FIG. 2 after the second step of an embodiment of the invention.

After the silicon chip 10 has been diffused as in the first step, an epitaxial layer 20 of N type conductivity is grown as shown in FIGS. 3 and 4 on the substrate 10. Two vapor growth processes have been developed for the formulation of epitaxial layers, that is silicon and germanium semiconductor devices. First is by vacuum evaporation of a single crystal thin film of semiconductor, e.g., silicon or a silicon substrate crystal. The other is an epitaxial growth utilizing the reduction of gaseous silicon tetrachloride on the substrate at elevated temperatures. These methods can be found in Handbook of Semiconductor Electronics, L. P. Hunter, editor, McGraw-Hill, second edition, 1962, subchapters 7.11. As shown in FIGS. 3 and 4, as the epitaxial layer 20 is grown, the highly doped n+ regions 11, 12 and 13 also expand into the epitaxial layer 20. FIG. 4 illustrates the epitaxial layer after it is fully grown or deposited. It will be noted that since the regions 12 and 13 have a dopant with a higher diffusion constant, these regions will grow at a more rapid rate than the region 11. Further, it will be noted that the regions 12 and 13 in FIG. 3 originally are spaced from the region 11 but due to the growth, these regions become contiguous to the region 11 after the layer 20 is fully grown.

Third step

Figure 5:
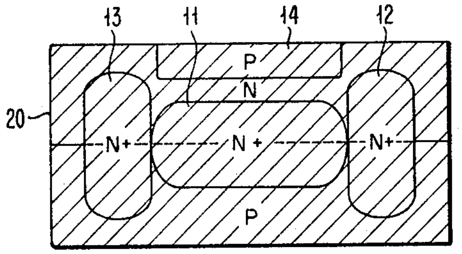
FIG. 5 illustrates the chip in FIG. 2 after the third step of an embodiment of the invention.

As shown in FIG. 5 in the third step, a P type base region 14 is diffused by masking and diffusing with a relatively high resistivity or normal doping impurities.

After the P type region 14 has been diffused as shown in FIG. 5, the device is again masked and diffused to produce regions 15, 16 and 17 which are highly doped n+ regions. This step is normally referred to as the emitter diffusion period and is usually the last diffusion step in a semiconductor process. During this step, the emitter 15 is produced as well as the highly doped collector contact regions 16 and 17.

After the emitter diffusion period, connections 18 and 19 are applied to collector contact diffusion regions 16 and 17 for connection to external leads.

Thus, it is seen that by using a relatively high diffusion constant for the impurity placed to develop the diffused regions 12 and 13, a relatively low resistance path is enabled to be established between the collector region 11 and the two collector contact regions 16 and 17. This thereby overcomes the limitation of the buried collector layer with respect to the base collector junction to provide a low resistance path between the buried contact regions 16 and 17. Further, this was accomplished without any etching.

DESCRIPTION OF THE PREFERRED EMBODIMENT

In the preferred embodiment of the invention, the above processes are accomplished by the following method.

Figure 6:
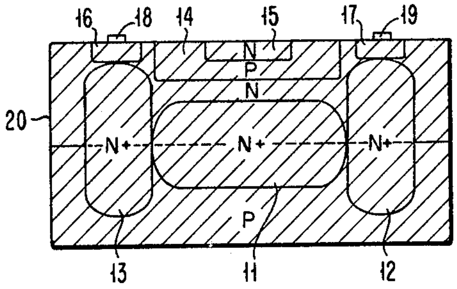
FIG. 6 illustrates the chip in FIG. 2 after the fourth step of an embodiment of the invention.

The starting substrate 10 is P type single crystal silicon 5–10 ohms-cm. resistivity and approximately —.010" thick. During the first time period, area 11 is selectively diffused through an oxide mask with arsenic to a depth of approximately $5\times10^{-4}$ cm. and with a resulting surface concentration of $5\times10^{20}$ atoms/cm.$^3$. This will require approximately 10 hours at 1250° C. If sufficient oxide ($SiO_2$) is grown over region 11 during this first time period of step 1, this and the previously grown oxide can be used to mask the diffusion for regions 12 and 13. If not, new oxide must be grown for the second time period of step 1. The phosphorus diffusion for regions 12 and 13 should be about $3\times10^{-4}$ cm. deep and have a final surface concentration of approximately $3\times10^{20}$ atoms/cm.$^3$. This will require approximately 2 hours at 1100° C. The oxide is now removed and the surface etched in preparation for epitaxial growth of step 2. A .1–2.0 ohms-cm. n type epitaxial film 20 is now grown over the entire surface to a thickness of $5\times10^{-4}$ cm. This is grown at 1200° C. at a rate of $.3\times10^{-4}$ cm./min. During this growth (shown in FIGS. 3 and 4), the arsenic and phosphorus from regions 11, 12 and 13 out-diffuse for a distance of $1\times10^{-4}$ cm. and $3\times10^{-4}$, respectively. This difference is due to the fact that the diffusion constant of phosphorus is ten times that of arsenic. The base and emitter diffusion are now performed in a conventional manner as shown in FIGS. 4 and 5. The base 14 is produced by a boron diffusion and redistribution cycle equivalent to 100 minutes at 100° C. and the subsequent emitter diffusion will bring the depth of the collector base junction to $2\times10^{-4}$ cm. and a final base surface concentration to $1\times10^{19}$ atoms/cc. An emitter diffusion depth of $1.3\times10^{-4}$ cm. can be accomplished with a phosphorus diffusion and redistribution cycle equivalent to 110 minutes at 950° C. to produce a final emitter surface concentration of $1\times10^{21}$ atoms/cc. for emitter 15 and regions 16 and 17. Note that the collector contact regions 16 and 17 are made with the same diffusion as the emitter. Since the diffusion depths of the phosphorus regions 12 and 13 and arsenic region 11, buried regions will remain at a 3:1 ratio. Regions 13 and 12 will run together during the emitter diffusion while a space of approximately $1\times10^{-4}$ cm. will remain between the base diffusion 14 and the arsenic buried region 11. A final impurity arrangement will be as shown in FIG. 6.

Electrical contacts for the base 14 and emitter 15 are not shown; however, conventional contacts can be made to these regions.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A method for simultaneously forming a buried semiconductor layer together with a connection path for electrically connecting said buried layer to the semiconductor surface comprising:

depositing one the surface of a sublayer a first and a second highly doped region;
  said first and second highly doped regions being deposited on said sublayer adjacent to each other;
  said first and second highly doped regions being of the same type conductivity;
  said first doped region containing dopant having a substantially higher diffusion constant than the diffusion constant of said second doped region;
  said first and second regions being deposited on said sublayer adjacent to each other so that a subsequent diffusion will cause said first region to diffuse to said second region and said second region to diffuse to said first region so that said regions physically contact each other;

growing a layer of semiconductor material on and over said surface of said sublayer and said first and second doped regions;
  said growing causing said first and said second regions to outwardly diffuse and to diffuse toward each other and thereby contact each other;
  said diffusion constant of said first region causing said first region to penetrate said layer of semiconductor material to a greater extent than said second region whereby said first region penetrates further toward the surface of said layer than said second region.

2. A method according to claim 1 including:

(a) diffusing a third region on said layer of semiconductor material;
  said third region being of the opposite conductivity of said layer and said first and second regions;
  said third region being diffused on the side of said layer which is opposite said first region;

(b) diffusing a fourth region on said third region;
  said fourth region being of the opposite conductivity of said third region;
  said fourth region being diffused on the side of said third region which is opposite said layer.

References Cited

UNITED STATES PATENTS

| | | | |
|---|---|---|---|
| 3,183,128 | 5/1965 | Leistiko | 148—187 X |
| 3,260,902 | 7/1966 | Porter. | |
| 3,268,374 | 8/1966 | Anderson | 148—175 |
| 3,340,598 | 9/1967 | Hatcher | 148—175 |

HYLAND BIZOT, Primary Examiner

U.S. Cl. X.R.

148—186, 188, 191